United States Patent [19]
Skrovan et al.

[11] Patent Number: 6,006,765
[45] Date of Patent: Dec. 28, 1999

[54] MEGASONIC CLEANING METHODS AND APPARATUS

[75] Inventors: John Skrovan; Guy F. Hudson, both of Boise, Id.

[73] Assignee: Micron Technology, Inc., Boise, Id.

[21] Appl. No.: 09/188,019

[22] Filed: Nov. 6, 1998

Related U.S. Application Data

[62] Division of application No. 08/867,241, Jun. 2, 1997, Pat. No. 5,849,091.

[51] Int. Cl.$^6$ .................. B08B 3/12; B08B 6/00
[52] U.S. Cl. .................. 134/1.3; 134/1
[58] Field of Search .................. 134/1, 1.3, 18, 134/26, 27, 28, 29, 36, 37, 102.2

[56] References Cited

U.S. PATENT DOCUMENTS

| | | | |
|---|---|---|---|
| 5,014,727 | 5/1991 | Aigo | 134/102 |
| 5,415,191 | 5/1995 | Mashimo et al. | |
| 5,456,759 | 10/1995 | Stanford, Jr. et al. | 134/1 |
| 5,520,205 | 5/1996 | Guldi et al. | 134/98.1 |
| 5,533,540 | 7/1996 | Stanasolovich et al. | 134/155 |
| 5,579,792 | 12/1996 | Stanasolovich et al. | 134/184 |
| 5,800,626 | 9/1998 | Cohen et al. | 134/1.3 |
| 5,849,091 | 12/1998 | Skrovan et al. | 134/1 |

OTHER PUBLICATIONS

S. Wolf et al., "Silicon Processing for the VLSI Era", *Process Technology*, vol. 1, Title Page, Chapter 15, Lattice Press, Sunset Beach, CA, pp. 514–538 (1990).

Declaration of Guy F. Hudson, dated Sep. 11, 1997, 1 pg.

*Primary Examiner*—Randy Gulakowski
*Assistant Examiner*—Shamim Ahmed
*Attorney, Agent, or Firm*—Mueting, Raasch, & Gebhardt, P.A.

[57] ABSTRACT

A cleaning method for use in fabrication of integrated circuit devices includes immersing a surface of a substrate assembly into a cleaning solution having a first pH. The first pH of the cleaning solution is controlled by introducing gas bubbles into the cleaning solution. The gas bubbles include a reactive component that alters the first pH of the cleaning solution to attain a second pH of the cleaning solution that is different than the first pH.

12 Claims, 3 Drawing Sheets

6,006,765

MEGASONIC CLEANING METHODS AND APPARATUS

This is a division of application Ser. No. 08/867,241, filed Jun. 2. 1997, now U.S. Pat. No. 5,849,091, which is incorporated herein by reference.

FIELD OF THE INVENTION

The present invention pertains to the cleaning of surfaces in the fabrication of integrated circuit devices. More particularly, the present invention relates to megasonic cleaning methods and apparatus for cleaning surfaces through the use of gas bubbles.

BACKGROUND OF THE INVENTION

Various methods are currently, utilized for the removal of small particles from surfaces, such as a surface of a wafer in the fabrication of integrated circuit devices. Particles or contaminates are removed by a variety of mechanisms including ultrasonic techniques, high pressure spraying techniques, mechanical scrubbing techniques etc. Such particle or contaminant removal is commonly carried out after a variety of process steps and before carrying out other process steps. For example, particle or contaminant removal, i.e., cleaning, is necessary after the performance of sawing, lapping, planarization, polishing, and before other device fabrication steps are performed, such as metalization, chemical vapor deposition, epitaxy, etc. Further, and more specifically, for example, after planarization has been performed, such as with the use of a slurry including silica or alumina particles, a post planarization clean is performed prior to carrying out other fabrication steps. The small particles or contaminants resulting from the fabrication steps above, tenaciously hold to a surface and typically require relatively large forces to remove them, in part due to the electrostatic potential of such particles.

The use of ultrasonic energy to enhance the cleaning action of solutions used to clean semiconductor wafer surfaces is well known. Such ultrasonic agitation provided by the ultrasonic energy typically is provided by using transducers operating at intermediate frequencies. i.e., 20–50 KHz. With the use of ultrasonic energy, bubbles are formed in the cleaning solution in which the wafers are immersed and the bubbles collapse under the pressure of the ultrasonic agitation. This produces shock waves which impinge on the wafer surfaces. The bubble collapsing is known as cavitation. The shock waves dislodge and displace particles to be carried away in the cleaning solution.

Further, the use of high frequency, or megasonic frequencies, for example, in the range of 0.2–5.0 MHz, is also well-known. The use of such high frequencies has also resulted in improved cleaning, particularly on substrates or wafers with very small, micron size elements disposed thereon. Further, use of such high frequencies provides a gentler cleaning action on the wafers and/or substrates than is attainable with an intermediate frequency. Therefore, such gentler cleaning action results in less damage during cleaning operations.

Use of megasonic energy is more efficient than ultrasonic cleaning for submicrometer particle removal because it functions via a different mechanism than ultrasonic cavitation. Because megasonic energy occurs at higher frequencies than ultrasonic energy, the pressure wave that forms generates a pulse so rapidly that the vacuum bubbles do not have time to form as in the use of ultrasonic energy. Consequently, megasonic energy consists of a series of pressure waves. When applied parallel to a surface, these waves dislodge particles. Usually this occurs by allowing a thin film of the cleaning solution, such as deionized water, to form between the particle and the surface being cleaned, thereby reducing the attraction between the surface and the particle to facilitate removal of the particle.

One illustration of a current method utilized for cleaning wafer surfaces, such as after a planarization process is performed, includes the immersion of the wafers in deionized water while megasonic energy is projected therethrough. During the cleaning of the wafers, the tank in which the liquid is held, is dumped and refilled one or more times. This dumping and refilling appears to draw in air and create an air/liquid interface across the surface of the wafer which appears to enhance the megasonic cleaning method. However, dumping and refilling the megasonic bath consumes a large amount of the deionized water and/or whatever chemicals might be alternatively utilized as the liquid for performing the cleaning of the wafer. Further, performing such dumping and refilling operations is also an inefficient use of time.

Also, in performing cleaning operations, it is in some circumstances, desirable to control the pH of the liquid held by the cleaning tank in which the wafers are immersed. For example, after a highly acidic or basic clean has been performed, a deionized water clean is then typically used before proceeding with any further process steps. However, it may not be desirable to perform a neutral deionized water clean immediately following a highly acidic or basic clean. Rather, it may be more desirable to use an acidic or basic deionized water bath.

Accordingly, there is need in the art for alternative megasonic cleaning methods which overcome the disadvantages as described above. The present invention overcomes these problems and overcomes other problems as will become apparent to one skilled in the art from the description below.

SUMMARY OF THE INVENTION

A method in accordance with the present invention for use in fabrication of integrated circuit devices, includes immersing a surface of a substrate assembly into a cleaning solution having a first pH. The first pH of the cleaning solution is controlled by introducing gas bubbles into the cleaning solution. The gas bubbles include a reactive component that alters the first pH of the cleaning solution to attain a second pH of the cleaning solution that is different than the first pH.

In several embodiments of this method, the surface is previously subjected to a cleaning process utilizing a highly acidic or basic component prior to immersing the surface into an acidic or basic deionized water clean.

DETAILED DESCRIPTION OF THE EMBODIMENTS

In the following detailed description, reference is made to the accompanying figures which form a part hereof, and in which is shown by way of illustration specific embodiments in which the invention may be practiced. These embodiments are described in sufficient detail to enable those skilled in the art to practice the invention. It is to be understood that other embodiments may be utilized and that changes may be made without departing from the scope of the present invention as defined in the accompanying claims.

The terms wafer and substrate assembly are used interchangably herein and include any semiconductor based structure, i.e., such as a semiconductor substrate having one or more layers or structures formed thereon. Both terms are to be understood as including silicone-on-sapphire (SOS) technology, silicon-on-insulator (SOI) technology, doped and undoped semiconductors, epitaxial layers of silicon supported by a base semiconductor, as well as any other semiconductor based structures well known to one skilled in the art. Furthermore, when a reference is made to a wafer or a substrate assembly in the following description previous process steps may have been utilized to form regions/junctions in a semiconductor based structure previously formed. The following detailed description is, therefore, not to be taken in a limiting sense, as the scope of the present invention is defined by the appended claims. The present invention contemplates the cleaning of any surface of a wafer, semiconductor substrate or substrate assembly and is in no manner limited to any particular surface.

Figure 1:
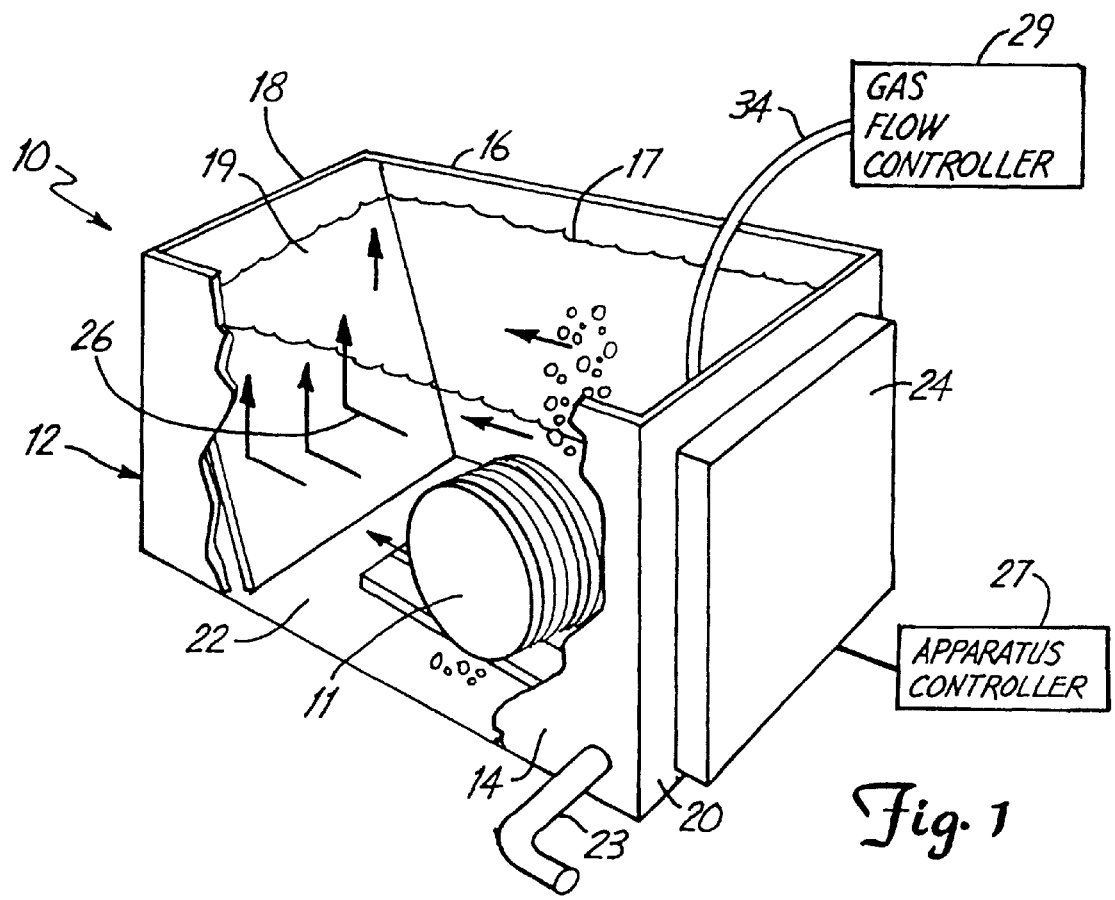
FIG. 1 is a cutaway perspective view of a megasonic cleaning apparatus in accordance with the present invention.

The megasonic cleaning apparatus 10 in accordance with the present invention shall be described with reference to FIGS. 1–4. Thereafter, illustrative methods of cleaning particles from a surface using methods in accordance with the present invention shall be described with reference to FIGS. 1–6. As shown in FIG. 1, megasonic cleaning apparatus 10 includes a tank housing 12, such as a quartz tank housing, which is suitable to hold a cleaning solution 13 therein. The cleaning solution 13 may include any known liquid for accomplishing a desired cleaning or etching of one or more surfaces of one or more semiconductor substrates, substrate assemblies, or wafers, such as shown generally, wafers 11 in FIG. 1. For example, the cleaning solution 13 may be deionized water, an RCA solution, a diluted HF solution, an ammonium hydroxide solution, any other weak or strong acid, or any other weak or strong base.

The wafers 11 are typically supported within the cleaning solution 13 within the tank housing 12 by a holder or a rack (not shown) for ease of immersion into the cleaning solution 13. Such a holder may include a mechanical agitation device for agitating the holder within the cleaning solution 13 to enhance cleaning in the megasonic cleaning apparatus 10. The holder may be moved under robotic control as is known to one skilled in the art. However, any holder and movement mechanism for immersing the wafers 11 in the cleaning solution 13 is suitable. Further, any number of wafers, substrate assemblies, etc. may be immersed for cleaning in the cleaning solution 13.

The tank housing 12 includes a first sidewall 14 and a second sidewall 16 extending substantially orthogonally from respective sides of a bottom wall 22. Further, the tank housing 12 includes end walls 18 and 20 extending substantially orthogonally to respective ends of bottom wall 22 to define a volume within the tank housing 12 in which the cleaning solution 13 is held. The tank housing 12 includes an input port 23 for introduction of cleaning solution 13 therein and may be positioned at any suitable location. For example, the input port 23 may be an opening in the tank housing fitted with an input feed line as shown in FIG. 1, or may be any other method of introducing the cleaning solution 13 into the tank housing 12, such as a line running down one of the walls of the tank housing 12.

The tank housing 12 also includes an overflow region for the overflow of cleaning solution 13 having particles captured thereby cleaned from the surfaces of the wafers 11. Such particles typically rise to the surface 17 of the cleaning solution 13 and are transported out of the tank housing 12. The overflow region shown in FIG. 1 is the entire perimeter of side and end walls defining the top opening into the tank housing 12 such that cleaning solution having removed particles therein may be transported or overflowed out of the tank housing 12 at any point along the perimeter defining the opening. However, one skilled in the art will recognize that any overflow mechanism may be used, such as, for example, a lower portion defined in one of the walls, an opening in several walls or any other suitable method for transporting particles in the cleaning solution out of the tank housing 12.

Further, a recirculation apparatus (not shown) may be used in conjunction with the present invention to collect overflow from the tank housing 12, filter such overflow to remove particle or contaminants and then recharging the filtered cleaning solution back into the tank housing 12, such as, via input port 23. For example, if the cleaning solution is deionized water, a recirculation apparatus is typically not used. However if the cleaning solution is more difficult to dispose of or costly to use, then recirculation may be utilized.

The megasonic cleaning apparatus 10 includes one or more megasonic transducers 24, such as an array of transducers, for projecting megasonic energy through the cleaning solution 13 held in the tank housing 12. The one and more megasonic transducers 24 produce waves of essentially single and constant frequency, which results in a substantially uniform pattern of standing waves being set up within the cleaning solution 13 as represented by arrows 26. The standing waves travel parallel to the surface to be cleaned. Further, the standing waves 26 are reflected off end wall 18 and thus, to reduce the reflection of the waves that may cause destructive interference with the standing waves projected through the cleaning solution 13 by one or more transducers 24, a quartz deflector plate 19 is utilized to deflect the standing waves as shown in FIG. 1. Such a destructive interference problem may be corrected in this or any other number of manners, and corrective measures are in no manner critical to the present invention as described in the accompanying claims.

The megasonic transducers 24 may include any suitable megasonic transducer for projecting megasonic energy through cleaning solution 13. For example, the suitable transducers project energy at high frequencies in the range of about 0.2 to about 5.0 MHz. The megasonic transducer may be positioned at any of the walls forming the tank housing 12, including any side wall, end wall or bottom wall, as long as the waves projected through the cleaning solution 13 are parallel to the surface of the wafers to be cleaned. Even transducers positioned to project energy down into the solution from the top of the apparatus may be utilized.

For example, such transducers 24 may include transducers as utilized in megasonic cleaning systems such as the SMS Semi-Automatic Wet System including megasonic cleaning available from SubMicron Systems. Inc., or a megasonic wafer cleaning system available from Verteq Inc., STEAG, or Santa Clara Plastics. Further, each of these systems or any other megasonic cleaning system may be modified to practice the present invention as described in accompanying claims. The control of the transducers 24, as well as any other controllable element of the cleaning apparatus, for example, a robotic holder, is shown generally in FIG. 1 as apparatus controller 27.

As described in the Background of the Invention section the megasonic energy consists of a series of pressure waves 26. When the waves 26 are applied parallel to surfaces 15 of wafers 11 as shown in FIGS. 1–4, the waves dislodge particles. This is accomplished by allowing a thin film of the cleaning solution 13 to form between the particles and a surface 15, thereby reducing the attraction between the surface 15 and the particles to facilitate removal thereof.

Figure 4:
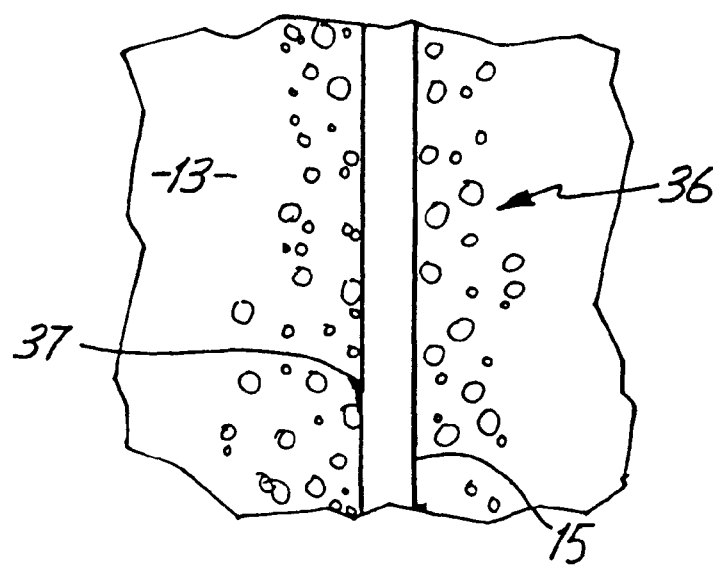
FIG. 4 is a detailed view of a portion of a wafer immersed in the megasonic cleaning apparatus of FIG. 1.

In accordance with the present invention, in order to enhance the ability of the megasonic energy to remove the particles from the surfaces 15 of the wafers 11, gas bubbles 36 are passed across the surfaces 15. Gas bubbles passing across a surface refers to the bubbles passing at least in close proximity to surfaces and further may include having some of the gas bubbles being in contact with surfaces 15 (FIG. 4).

Figure 2:
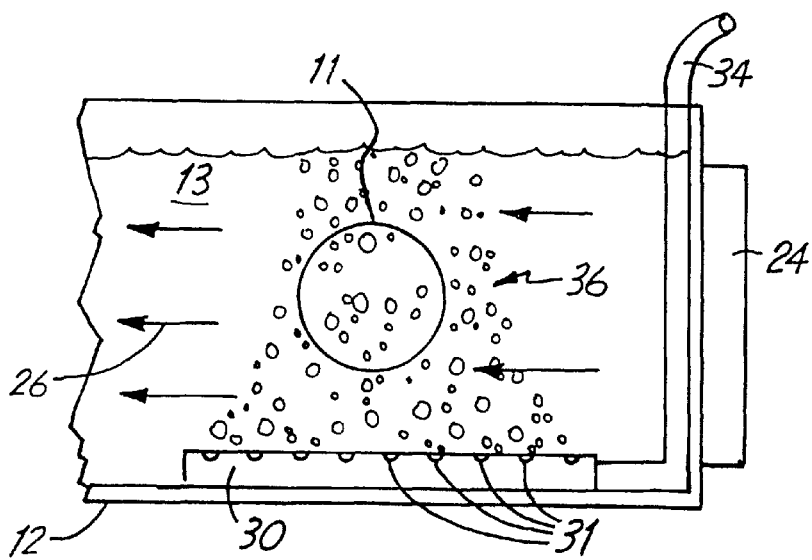
FIG. 2 is an illustrative side view of a portion of the megasonic cleaning apparatus of FIG. 1 with one side wall removed.
Figure 3:
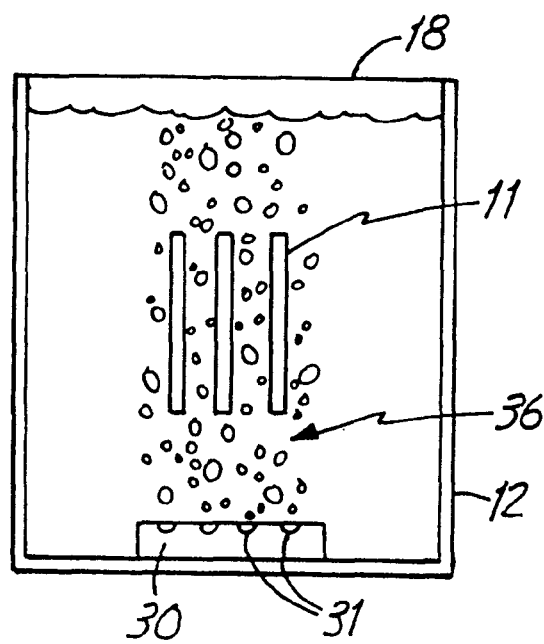
FIG. 3 is an illustrative end view of a portion of the megasonic cleaning apparatus of FIG. 1 with one end wall removed.

To facilitate the passing of gas bubbles 36 across the surfaces 15, a gas is provided, such as, for example, by injection, into the cleaning solution 13 at a position relative to the wafers 11 such that movement of the bubbles in the solution is across the surfaces 15. Preferably, the gas bubbles 36 are provided at a position below the wafers 11 and between the wafers 11 and bottom wall 22 of the tank housing 12. For example, as generally shown in FIGS. 1–3, a gas feed line 34 is provided which is terminated within the tank housing 12 by a gas injection device 30. Although the gas feed line 34 is shown as being positioned alone and down a wall of the tank housing 12, it should be apparent that any manner of getting the gas to the desired position is suitable. For example, a gas feed line through the bottom wall, an end wall, or any feeding mechanism may be suitable.

Any gas injection device 30 may be utilized which is suitable for producing gas bubbles 36 at a position relative to the wafers 11 such that when the gas bubbles move towards the surface 17 of cleaning solution 13 which is open to the atmosphere, the gas bubbles 36 pass across the surfaces 15 of wafers 11. Such gas bubbles 36 passing across the surfaces 15 enhance the megasonic cleaning performed by the apparatus 10.

For example, in the generalized illustrative embodiment of FIG. 1, the gas injection device 30 may be an integral portion of the gas feed line 34 itself having one or more openings 31 at the terminated end of the feed line 34. In addition, the injection device may be one or more gas feed lines terminated below the wafers having one or more openings define therein. For example, the openings may be a quarter of an inch apart defined in the gas feed line along the entire or only a portion of the bottom wall of the tank housing 12. Further, the injection device 30, may be a gas manifold having a plurality of openings defined therein for producing a substantial number of gas bubbles in the cleaning solution 13. Likewise, the openings for injecting bubbles into the solution held in the tank housing 12, may be defined in the bottom wall 22 as opposed to a separate structure within the tank housing 12. For example, multiple gas feed lines provided to multiple openings in the bottom wall 22 may be used.

In another embodiment of the injection device 30, the device 30 may include a sparging apparatus for receiving gas through the gas feed line 34 and which provides a cloud of very small bubbles. A sparging apparatus may include any device suitable for providing such a cloud of small bubbles. For example, the sparging apparatus may make use of a baffle structure, a spraying device, or any other technique. The small bubbles created by the sparging apparatus are much like those created using known apparatus, such as commonly known and used aeration devices.

It should be readily apparent that any injection device suitable for providing gas bubbles to a desired position in the cleaning solution may be utilized in accordance with the present invention as shown by the numerous and various configurations described above. In each of the above described embodiments, the openings through which a gas is provided into the cleaning solution 13 are described as being provided to a position below the wafers 15 and between the wafers 15 and the bottom wall 22. It is possible that gas bubbles could be provided through some other mechanism to an alternative position such that they pass across the wafer surfaces 15, i.e., for example, such as between the wafers 11 and a side or end wall. However, it is preferable, that the gas bubbles 36 are provided below the wafers 11 so as to naturally rise up and across the surfaces 15 of the wafers 11 to the surface 17 of cleaning solution 13 open to the atmosphere carrying with them particles cleaned from surfaces 15.

The enhanced cleaning action of the megasonic clean appears to be due to one of several factors. The gas bubbles 36 which pass across the surfaces 15 of wafers 11 form gas/liquid/surface interfaces 37 at the surfaces 15 of wafers 11. This interface 37 is believed to form a reflection point for the megasonic energy which in addition to the surface tension between the gas, liquid and surface enhances particle removal and transport away from the wafer surfaces 15. Any number of bubbles formed which pass across the surfaces 15 provides benefit. However, by using a sparging apparatus as the injection device 30, it is believed that as the small cloud of bubbles passes across the wafers 11, there is a further increase in the amount of liquid/gas/surface interface 37 increasing the efficiency of the megasonic cleaning using the megasonic cleaning apparatus 10.

Further, the enhanced cleaning action is also believed to be due to the use of the gas bubbles to carry particles which have been dislodged by the megasonic clean away from the surfaces 15 of the wafers 11 before they redeposit thereon. Such transport to the surface 17 of the cleaning solution 13 is accomplished by the natural rise of the bubbles 36.

The gas injected into the cleaning solution 13 to form bubbles 36 may be any gas which is nonreactive with the cleaning solution 13. For example, such gases may include nitrogen, argon, helium, or any other gas that is nonreactive with the cleaning solution 13. In one illustrative embodiment, the cleaning solution 13 may be deionized water and the gas injected therein may be one of the above listed nonreactive gases.

In another embodiment, gases which react with cleaning solution 13 may also be utilized so as to enhance the clean through bubbles passing across the surfaces 15 and/or provide an effective means of controlling or altering the pH of the cleaning solution 13 utilized in the megasonic cleaning apparatus 10. For example, a gas having a reactive component can be injected into the cleaning solution 13 which alters the pH of the cleaning solution 13. The gas injected may include a single gas component, such as carbon dioxide, or may be a gas mixture, such as a nonreactive gas including a reactive component, such as argon containing a small amount of ammonia. The amount of gas may be controlled by one or more flow controllers, mixers, or any other devices utilized for supplying gases as known to one skilled in the art, shown generally as gas flow controller 29 in FIG. 1.

Figure 5:
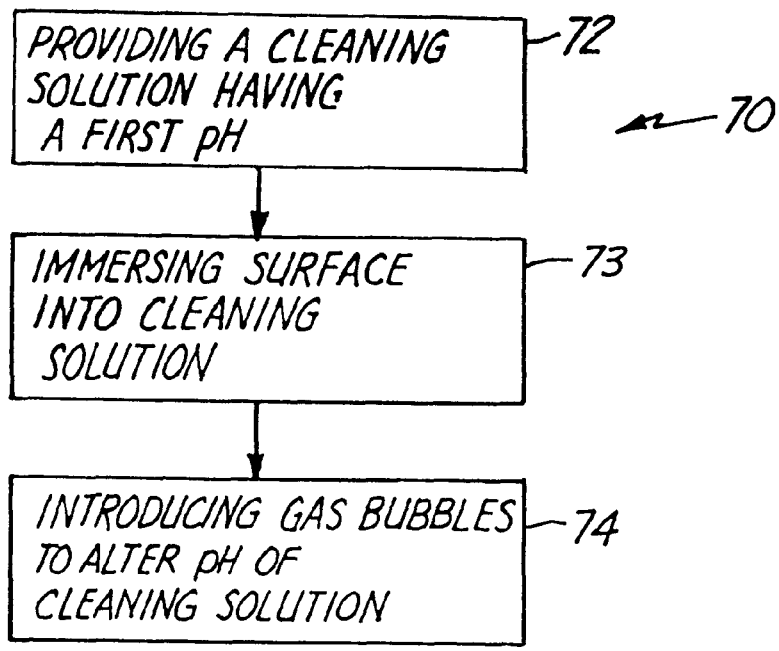
FIGS. 5 and 6 are flow diagrams of illustrative methods for using the gas bubbles in accordance with the present invention for in situ control of the pH of the cleaning solution.
Figure 6:
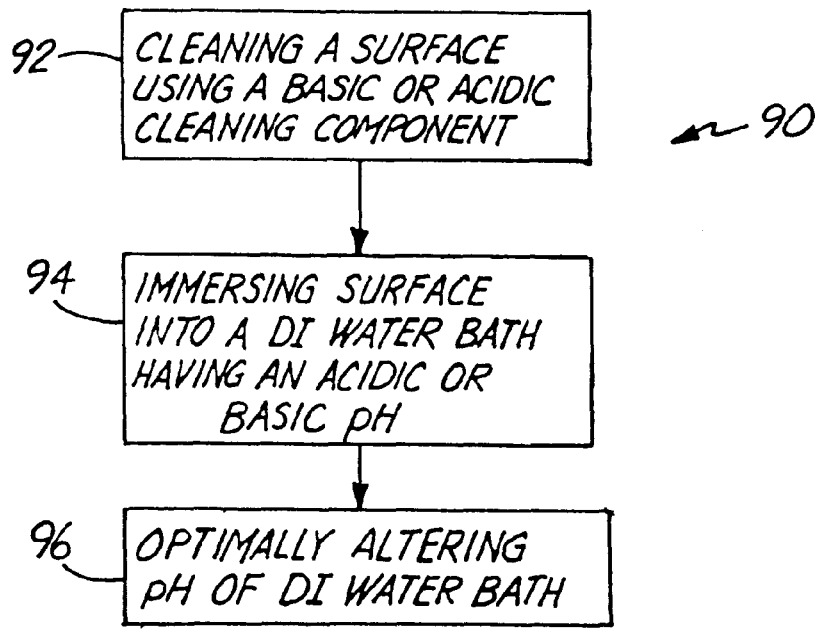

Several illustrations of the use of gas bubbles to control the pH of a cleaning solution are described with reference to FIGS. 1–6, and more particularly, with reference to FIGS. 5 and 6. Generally, in a first method 70 as shown in FIG. 5, a cleaning solution is provided which has a first pH as generally represented by block 72. The pH of the cleaning solution provided (block 72) can be attained by providing gas bubbles thereto in a manner and to a position in the cleaning solution as described above or in any other known manner and/or at any position within the tank housing holding the solution. For example, if a deionized water bath is performed and the desired pH is to be acidic, then a control flow of carbon dioxide may be introduced into the deionized water in the tank housing 12 as bubbles to form some carbonic acid therein. Alternatively, a cleaning solution already having the first pH may be introduced into the tank 12. The pH of the cleaning solution may be acidic, basic or may be neutral, as in a neutral deionized water bath.

Introduction of gas bubbles into the tank housing 12 to control the pH of the cleaning solution can effectively control pH as compared to other methods of adjusting the pH. For example, introducing gas bubbles into the tank 12 by a gas feed line has a reduced residual effect as compared to the use of trying to control the pH with a solution. In other words, the residual effect of gas remaining in a gas feed line is somewhat reduced as compared to the effect of residual solution remaining in a line providing a liquid pH altering component to the cleaning solution. Further, the dumping and refilling of the tank to provide a cleaning solution having a different pH is eliminated, i.e, such as in the use of spiked tanks. Further, introduction of gas bubbles into the tank is generally simpler than other methods of spiking the tank, i.e., liquid solution spiking. The storage of the gas for production of gas bubbles is generally safer, i.e., storage of carbon dioxide to form carbonic acid by gas bubbling is simpler and safer than storage and use of carbonic acid for liquid spiking. In addition, the likelihood of overspiking is reduced when using a gas bubbling technique that can be more readily controlled.

With the cleaning solution 13 having a first pH provided in the tank 12, one or more surfaces, i.e., wafers 11, to be cleaned are immersed in the solution 13 as represented by block 73. Thereafter, the clean is performed, and the pH of the cleaning solution may be altered to attain a second pH by introducing gas bubbles into the solution 13 (block 74). The pH may be altered either from neutral to basic, basic to neutral, acidic to neutral, neutral to acidic, or basic to acidic, basic to less or more basic, acidic to less or more acidic, or any combination thereof or along any continuum therebetween.

Examples of such pH modification, includes injection of carbon dioxide into a neutral deionized water cleaning solution. As such, carbonic acid is formed in the deionized water to alter the pH of the cleaning solution 13 into the acidic regime. As opposed to altering the pH into the acidic region, a gas mixture of a nonreactive gas containing a small percentage of ammonia which will solubilize in the deionized water making the pH of the cleaning solution more basic can be utilized.

As shown, different pH's of the cleaning solution 13 can be attained in situ while the cleaning solution is in the tank housing 12 before or after the wafers are immersed in the solution. Therefore, such in situ alteration of the cleaning solution pH is possible in conjunction with enhancement of the megasonic cleaning of the wafers by passing bubbles across the wafers as megasonic energy is projected through the cleaning solution without dumping and refilling the cleaning solution 13, i.e., deionized water or any other chemical solution. Alternatively, the pH may be controlled separately, i.e., before the wafers are immersed.

The illustrations using ammonia and carbon dioxide above with regard to controlling the pH of the cleaning solution, i.e., deionized water, are clearly not an exhaustive list of the cleaning solutions or gases which may be utilized in accordance with the present invention to control parameters of the cleaning solution in situ during the cleaning process. For example, $NH_3$ may be used to control the pH of an RCA clean, $CO_2$ and $Cl_2$ may be used to control the pH of an acidic clean, $SF_6$ may be used to control the pH of an HF clean, etc. Generally, the pH of any cleaning solution can be modified in a manner as described herein depending upon the application with which the clean is used, for example, after planarization of a metalization step.

Illustration of the control of pH and advantages of such control are described with reference to FIG. 6 and with respect to deionized water cleans after planarization of surfaces, such as, for example, surfaces including metalized regions and/or silicon based material regions, i.e., BPSG. For example, planarization or polishing of a surface having metalized regions, with for example, a slurry including alumina or silica particles, or such particles fixed on a pad, or any other planarization technique, result in silica or alumina particles and/or other ionic contaminants which need to be cleaned from the surface. Typically, after metal planarization is performed, a highly acidic clean is used, such as an HF clean, i.e., vapor or dip, as is commonly known to those skilled in the art. Such a clean typically has a pH less than about 2. On the other hand, when performing a planarization of a surface having silicon-based regions, a highly basic clean is typically utilized such as an ammonium clean (i.e., an RCA clean), as is commonly known to those skilled in the art. Such a basic clean typically has a pH greater than about 10.5. Both highly acidic or highly basic cleans are represented generally by block 92 of the cleaning method 90 of FIG. 6.

However, such cleans (block 92) do not complete the cleaning process as a deionized water bath is typically necessary prior to the completion of any further fabrication steps. The deionized water bath is typically necessary to stop the previous clean or etch step which utilized a highly basic or highly acidic component. For example, when cleaning an oxide containing surface, i.e., silicon oxide, BPSG, etc., the deionized water bath stops the clean or etch of the surface before undesired oxide removal occurs. However, it is undesirable to immerse wafers subjected to either highly basic or highly acidic cleans (block 92) directly into a neutral deionized water megasonic clean as the effectiveness of such a clean is reduced due to the shock of pH change from one clean to the other. In other words the neutral nature of the deionized water bath, as opposed to the negative or positive nature of an acidic or basic deionized water bath, reduces the effectiveness of the clean. In the case of the neutral deionized water bath, repulsive forces from the charged nature of the highly acidic or basic cleaning component are lost when the surface is immersed in the neutral bath. The neutral bath results in the possible redeposition of particles back on the surface being cleaned reducing the effectiveness of the cleaning process. When a basic or acidic deionized water bath is used, the repulsive forces are still present, such that the carrying away of particles away from the surface is enhanced. In other words, for the deionized water clean to be more effective, the deionized water bath should be acidic, i.e., at a pH in the range of about equal to the pH of the previously used highly acidic component to about 5, when the previous clean was highly acidic. Further, the bath should be basic, i.e., at a pH in the range of about equal to the pH of the previously used highly basic component to about 8, when the previously clean was basic. The present invention allows for in situ control of the pH during such a clean process, i.e., altering the pH in the same tank housing having the same cleaning solution without dumping and refilling.

It should be apparent that the pH of the deionized water bath is continuously altered because as the solution 13 of the bath overflows, additional deionized water is input, such as through port 23. As such, to maintain the pH of the bath as desired, gas bubbles are injected by injection device 30. Such injection may be in a continuous fashion or noncontinuous fashion. Further, the gas bubbles may include a reactive component for a partial time period or throughout the entire process, i.e., the use of reactive and nonreactive gas bubbles may be used in various combinations.

As represented by block 94, prior to immersing the wafers into the deionized water bath, the pH of the deionized water is altered by providing gas bubbles in the deionized water. For example, as previously described, providing carbon dioxide to the solution forms some carbonic acid to take the solution into the acidic region, whereas providing an ammonia component to the solution takes the deionized water into the basic region. Such an introduction of the gas bubbles may be performed in any manner as previously described.

After the wafers are immersed into the basic or acidic deionized water bath (block 94) (depending on whether the previous clean was acidic or basic), the pH of the solution can be altered as desired (block 96). For example, the pH of the bath is altered in the manners as described above with gas bubbles, such as with the use of ammonia or carbon dioxide.

It should be readily apparent that the above cleaning illustrations are generally described to show the introduction of gas bubbles into cleaning processes to obtain the advantages of pH control. These process are not the only cleaning processes which may benefit from such pH control and the present invention is not limited to the illustrations given, but only in accordance with the accompanying claims. For example, other cleaning processes which may benefit may include a gate oxide clean, a pre-silicon nitride deposition clean, a post planarization clean, and any other clean that may benefit from the invention herein, such as other oxide cleans.

Although the present invention has been described with particular reference to various embodiments thereof, variations and modifications of the present invention can be made within a contemplated scope of the following claims, as is readily known to one skilled in the art.

What is claimed is:

1. A cleaning method comprising the steps of:
    immersing a surface of a substrate assembly into a cleaning solution having a first pH, wherein the surface includes metalized regions, and further wherein prior to the immersing of the surface into the cleaning solution having the first pH, the surface was subjected to a cleaning process utilizing an acidic component having an acidic pH; and
    controlling the first pH of the cleaning solution by introducing gas bubbles into the cleaning solution, wherein the gas bubbles include a reactive component that alters the first pH of the cleaning solution to attain a second pH of the cleaning solution that is different than the first pH.

2. The method according to claim 1, wherein the second pH is in the range of less acidic than the acidic pH to about 5.

3. A cleaning method comprising the steps of:
    immersing a surface of a substrate assembly into a cleaning solution having a first pH, wherein the surface includes silicon based regions, and further wherein prior to immersing the surface into the cleaning solution having the first pH, the surface was subjected to a cleaning process utilizing a basic component having a basic pH; and
    controlling the first pH of the cleaning solution by introducing gas bubbles into the cleaning solution, wherein the gas bubbles include a reactive component that alters the first pH of the cleaning solution to attain a second pH of the cleaning solution that is different than the first pH.

4. The method according to claim 3, wherein the second pH is in the range of about 8 to a pH less basic than the basic pH.

5. The method according to claim 1, wherein the method further includes introducing gas bubbles into a solution resulting in the cleaning solution having the first pH prior to immersing the surface therein.

6. The method according to claim 1, wherein the gas bubbles are formed from a gas mixture including a nonreactive component that does not react with the cleaning solution and the reactive component that reacts with the cleaning solution altering the first pH to the second pH.

7. The method according to claim 6, wherein the cleaning solution is deionized water and the reactive component is carbon dioxide.

8. The method according to claim 1, wherein the method further includes projecting megasonic energy through the cleaning solution, and further wherein the controlling step includes introducing gas bubbles in proximity to the surface of the substrate assembly, wherein the bubbles pass across the surface of the substrate assembly as the bubbles rise to a surface of the cleaning solution.

9. The method according to claim 3, wherein the method further includes introducing gas bubbles into a solution resulting in the cleaning solution having the first pH prior to immersing the surface therein.

10. The method according to claim 3, wherein the gas bubbles are formed from a gas mixture including a nonreactive component that does not react with the cleaning solution and the reactive component that reacts with the cleaning solution altering the first pH to the second pH.

11. The method according to claim 10, wherein the cleaning solution is deionized water and the reactive component is ammonia.

12. The method according to claim 3, wherein the method further includes projecting megasonic energy through the cleaning solution, and further wherein the controlling step includes introducing gas bubbles in proximity to the surface of the substrate assembly, wherein the bubbles pass across the surface of the substrate assembly as the bubbles rise to a surface of the cleaning solution.

* * * * *

UNITED STATES PATENT AND TRADEMARK OFFICE
CERTIFICATE OF CORRECTION

PATENT NO.: 6,006,765
DATED: December 28, 1999
INVENTOR(S): Skrovan et al.

It is certified that error appears in the above-identified patent and that said Letters Patent is hereby corrected as shown below:

Col. 2, line 41, delete ",";

Col. 3, line 23, insert --,-- following "description";

Col. 3, line 43, insert --by-- between "generally" and "wafers" and delete "," therebetween;

Col. 5, line 9, insert --,-- following "section";

Col. 5, line 34, delete "alone" and insert --along--; and

Col. 8, line 57, insert --,-- following "words".

Signed and Sealed this

Eighth Day of May, 2001

NICHOLAS P. GODICI

Attest:

Attesting Officer

Acting Director of the United States Patent and Trademark Office